United States Patent
Kudo (10) Patent No.: US 9,600,427 B2
(45) Date of Patent: Mar. 21, 2017

(54) RECEIVER CIRCUIT AND SEMICONDUCTOR INTEGRATED CIRCUIT

(71) Applicant: Socionext Inc., Yokohama-shi, Kanagawa (JP)

(72) Inventor: Masahiro Kudo, Kawasaki (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/837,870

(22) Filed: Aug. 27, 2015

(65) Prior Publication Data

US 2016/0065189 A1    Mar. 3, 2016

(30) Foreign Application Priority Data

Sep. 3, 2014  (JP) .................................. 2014-179399

(51) Int. Cl.
| | |
|---|---|
| G11C 7/10 | (2006.01) |
| G11C 7/06 | (2006.01) |
| G06F 13/38 | (2006.01) |
| H04L 1/00 | (2006.01) |
| G06F 13/40 | (2006.01) |
| H04L 7/00 | (2006.01) |
| H04L 25/03 | (2006.01) |
| G11C 27/02 | (2006.01) |

(52) U.S. Cl.
CPC .......... *G06F 13/38* (2013.01); *G06F 13/4072* (2013.01); *H04L 1/0045* (2013.01); *H04L 7/0087* (2013.01); *H04L 25/03* (2013.01); *G11C 27/02* (2013.01)

(58) Field of Classification Search
USPC ................ 327/115, 116, 117, 118, 161, 185, 327/198–203, 208–218, 355–360; 377/47, 48
See application file for complete search history.

(56) References Cited

U.S. PATENT DOCUMENTS

| | | | |
|---|---|---|---|
| 6,389,490 B1 * | 5/2002 | Camilleri | G06F 5/12 365/189.07 |
| 2003/0048690 A1 | 3/2003 | Kikutake et al. | |
| 2005/0108308 A1 * | 5/2005 | Yasuda | G06F 7/58 708/250 |

(Continued)

FOREIGN PATENT DOCUMENTS

| | | |
|---|---|---|
| JP | 06-054016 A | 2/1994 |
| JP | 10-247175 A | 9/1998 |

(Continued)

*Primary Examiner* — Brandon S Cole
(74) *Attorney, Agent, or Firm* — Arent Fox LLP (57) ABSTRACT

A receiver circuit includes: a plurality of first holding circuits respectively latching a plurality of reception data pieces on the basis of a same clock signal; a comparison circuit respectively comparing first reception data pieces and second reception data pieces after a certain time elapses since the latch of the plurality of first holding circuits, the first reception date pieces being respectively latched by the plurality of first holding circuits, the second reception data pieces being respectively input to the plurality of first holding circuits; and a plurality of second holding circuits respectively latching the first reception data pieces when a first output signal of the comparison circuit indicates that the first reception data pieces and the second reception data pieces are identical.

13 Claims, 4 Drawing Sheets

(56) References Cited

U.S. PATENT DOCUMENTS

| | | | | |
|---|---|---|---|---|
| 2007/0064510 A1* | 3/2007 | Zerbe | ............... | G01R 31/31703 |
| | | | | 365/201 |
| 2007/0116165 A1 | 5/2007 | Tsuiki et al. | | |
| 2007/0162806 A1* | 7/2007 | Matsumoto | ............. | G06F 17/15 |
| | | | | 714/728 |
| 2012/0087194 A1* | 4/2012 | Oh | ....................... | G11C 7/1087 |
| | | | | 365/189.16 |
| 2014/0143292 A1* | 5/2014 | Yasuda | .................... | G06F 7/588 |
| | | | | 708/251 |
| 2015/0022252 A1* | 1/2015 | Venas | .................... | H03K 3/012 |
| | | | | 327/225 |

FOREIGN PATENT DOCUMENTS

| | | |
|---|---|---|
| JP | 2003-085130 A | 3/2003 |
| JP | 2007-115036 A | 5/2007 |
| JP | 4841927 B2 | 10/2011 |

* cited by examiner

RECEIVER CIRCUIT AND SEMICONDUCTOR INTEGRATED CIRCUIT

CROSS-REFERENCE TO RELATED APPLICATION

This application is based upon and claims the benefit of priority of the prior Japanese Patent Application No. 2014-179399, filed on Sep. 3, 2014, the entire contents of which are incorporated herein by reference.

FIELD

The embodiments discussed herein are directed to a receiver circuit and a semiconductor integrated circuit.

BACKGROUND

A data transfer method which has a plurality of FIFO memories storing each of a plurality of divided data transferred in parallel is known (refer to Patent Document 1). A timing instruction unit monitors a data storage state of each of the plurality of FIFO memories, and outputs a timing signal instructing reading of data when the data are stored at all of the FIFO memories. A plurality of holding units are provided to correspond to each of the plurality of FIFO memories, and download and hold the divided data stored at the plurality of FIFO memories in synchronization with the timing signal output from the timing instruction unit.

Besides, a skew correction circuit which has a detection unit detecting an edge of one transmission signal from among edges to be the same timing among a plurality of transmission signals transmitting parallel transmission paths is known (refer to Patent Document 2). A correction signal generation unit generates a correction signal in accordance with a cycle of the edge detected by the detection unit. A correction unit outputs the edges of the plurality of transmission signals with each other in synchronization with the correction signal generated at the correction signal generation unit.

Besides, a semiconductor device which has an input circuit downloading a plurality of data from outside in synchronization with a plurality of clock signals from outside is known (refer to Patent Document 3). A pulse signal generation circuit generates a pulse signal. A drive circuit supplies the plurality of data which are downloaded by the input circuit to an internal circuit while aligning at the same timing in accordance with a timing of the pulse signal.

Besides, an asynchronous transmission device which receives at least one notification signal which is transmitted in accordance with a transmission clock in accordance with a reception clock, is known (refer to Patent Document 4). A trigger signal transmission part outputs a trigger signal based on a symbol cycle of the notification signal. A notification signal transmission part outputs the notification signal whose timing is shifted for a predetermined time relative to a timing of the trigger signal output by the trigger signal transmission part. A trigger signal synchronization part receives the trigger signal output from the trigger signal transmission part to synchronize the trigger signal, and outputs a sampling timing signal which indicates a sampling timing of the notification signal which is output from the notification signal transmission part. A notification signal holding part holds the notification signal which is received from the notification signal transmission part in accordance with the sampling timing signal.

[Patent Document 1] Japanese Laid-open Patent Publication No. H10-247175
[Patent Document 2] Japanese Laid-open Patent Publication No. H6-54016
[Patent Document 3] Japanese Laid-open Patent Publication No. 2003-85130
[Patent Document 4] Japanese Patent No. 4841927

For example, there is a requirement to simultaneously receive a plurality of data output from an analog circuit at circuits existing at positions apart from one another in a semiconductor chip when a signal of the analog circuit is corrected by a digital circuit, or the like. To receive the plurality of data at the same timing, there is a method transmitting the plurality of data and a clock signal to a plurality of flip-flop circuits.

However, when a transmission distance becomes long, there is a possibility in which a skew between the data and the clock signal becomes large, and therefore, it is necessary to tighten a timing constraint as for all of the data and the clock signal when a transmission circuit is designed so as to satisfy a constraint for a setup/hold time enabling the flip-flop circuit to normally receive the data. Besides, when the skew is large, it is difficult to design at a required operating frequency.

SUMMARY

A receiver circuit includes: a plurality of first holding circuits configured to respectively latch a plurality of reception data pieces on the basis of a same clock signal; a comparison circuit configured to respectively compare first reception data pieces and second reception data pieces after a certain time elapses since the latch of the plurality of first holding circuits, the first reception date pieces being respectively latched by the plurality of first holding circuits, the second reception data pieces being respectively input to the plurality of first holding circuits; and a plurality of second holding circuits configured to respectively latch the first reception data pieces when a first output signal of the comparison circuit indicates that the first reception data pieces and the second reception data pieces are identical.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

Figure 1:
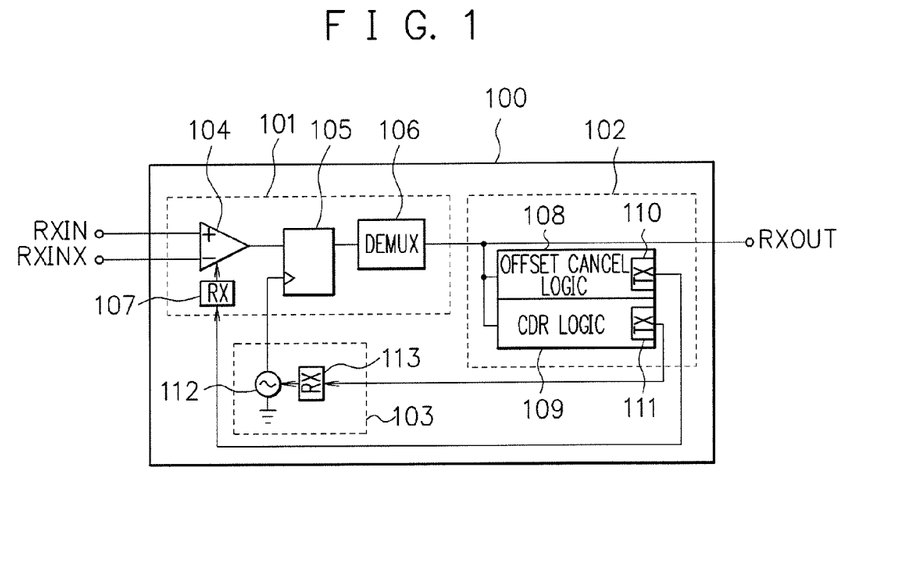
FIG. 1 is a view illustrating a configuration example of a semiconductor integrated circuit according to a first embodiment.

FIG. 1 is a view illustrating a configuration example of a semiconductor integrated circuit 100 according to a first embodiment. The semiconductor integrated circuit 100 is a receiving device, and includes a front-end circuit 101, a logic circuit 102, and a clock generation circuit 103. The front-end circuit 101 includes a differential amplifier 104, a sampling circuit 105, a demultiplexer 106, and a receiver circuit 107. The logic circuit 102 includes an offset cancellation logic circuit 108, and a clock data recovery logic circuit 109. The offset cancellation logic circuit 108 includes a transmission circuit 110. The clock data recovery logic circuit 109 includes a transmission circuit 111. The clock generation circuit 103 includes a phase interpolation circuit 112 and a receiver circuit 113.

Differential signals RXIN and RXINX are serial signals, and are input to the front-end circuit 101. The differential amplifier 104 amplifies the differential signals RXIN and RXINX. The sampling circuit 105 samples the signal amplified by the differential amplifier 104 in synchronization with a clock signal output from the clock generation circuit 103. The demultiplexer 106 converts the signal sampled by the sampling circuit 105 from the serial signal to a parallel signal, and outputs an output signal RXOUT.

The offset cancellation logic circuit 108 generates an offset cancellation data based on the output signal RXOUT to cancel an offset of the differential amplifier 104. The transmission circuit 110 transmits, for example, a six-bit offset cancellation data and the clock signal to the receiver circuit 107. The receiver circuit 107 receives, for example, the six-bit offset cancellation data and the clock signal, and outputs, for example, the six-bit offset cancellation data to the differential amplifier 104. The differential amplifier 104 outputs an amplification signal whose offset is canceled to the sampling circuit 105 based on the offset cancellation data.

The clock data recovery logic circuit 109 generates a phase control data based on the output signal RXOUT to control a phase of the clock signal output from the clock generation circuit 103. The transmission circuit 111 transmits, for example, a seven-bit phase control data and the clock signal to the receiver circuit 113. The receiver circuit 113 receives, for example, the seven-bit phase control data and the clock signal, and outputs, for example, the seven-bit phase control data to the phase interpolation circuit 112. The phase interpolation circuit 112 interpolates a phase of, for example, a four-phase reference clock signal based on the phase control data, and outputs the clock signal in a desired phase to the sampling circuit 105. It is difficult for the sampling circuit 105 to sample a correct data when the sampling is performed at a data transition timing of an input signal, and it is possible to sample the correct data when the sampling is performed at a timing when data of the input signal is stable. The clock data recovery logic circuit 109 controls the phase of the clock signal, and thereby, the sampling circuit 105 is able to sample at the timing when the data of the input signal is stable, and to recover the correct data.

As stated above, the transmission circuit 110 transmits the offset cancellation data of a plurality of bits to the receiver circuit 107. The receiver circuit 107 receives the offset cancellation data of the plurality of bits from the transmission circuit 110. Besides, the transmission circuit 111 transmits the phase control data of a plurality of bits to the receiver circuit 113. The receiver circuit 113 receives the phase control data of the plurality of bits from the transmission circuit 111.

When positions of the transmission circuit 110 and the receiver circuit 107 are apart, and when positions of the transmission circuit 111 and the receiver circuit 113 are apart, transmission distances of the offset cancellation data and the phase control data become long, and the skew between the plurality of bit data and the clock signal becomes large. In this case, there is a possibility in which the receiver circuits 107 and 113 cannot respectively receive the offset cancellation data and the phase control data correctly. When the receiver circuits 107 and 113 cannot correctly receive data of all bits simultaneously, the differential amplifier 104 and the phase interpolation circuit 112 are not able to perform proper operations. Accordingly, it is necessary for the receiver circuits 107 and 113 to correctly receive the data of all bits simultaneously.

Figure 2:
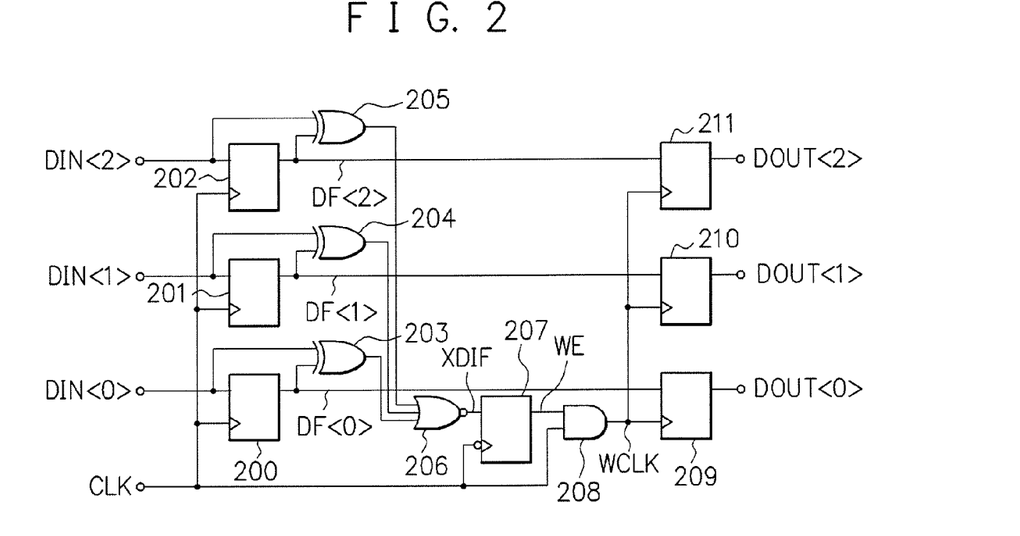
FIG. 2 is a circuit diagram illustrating a configuration example of a receiver circuit.
Figure 3:
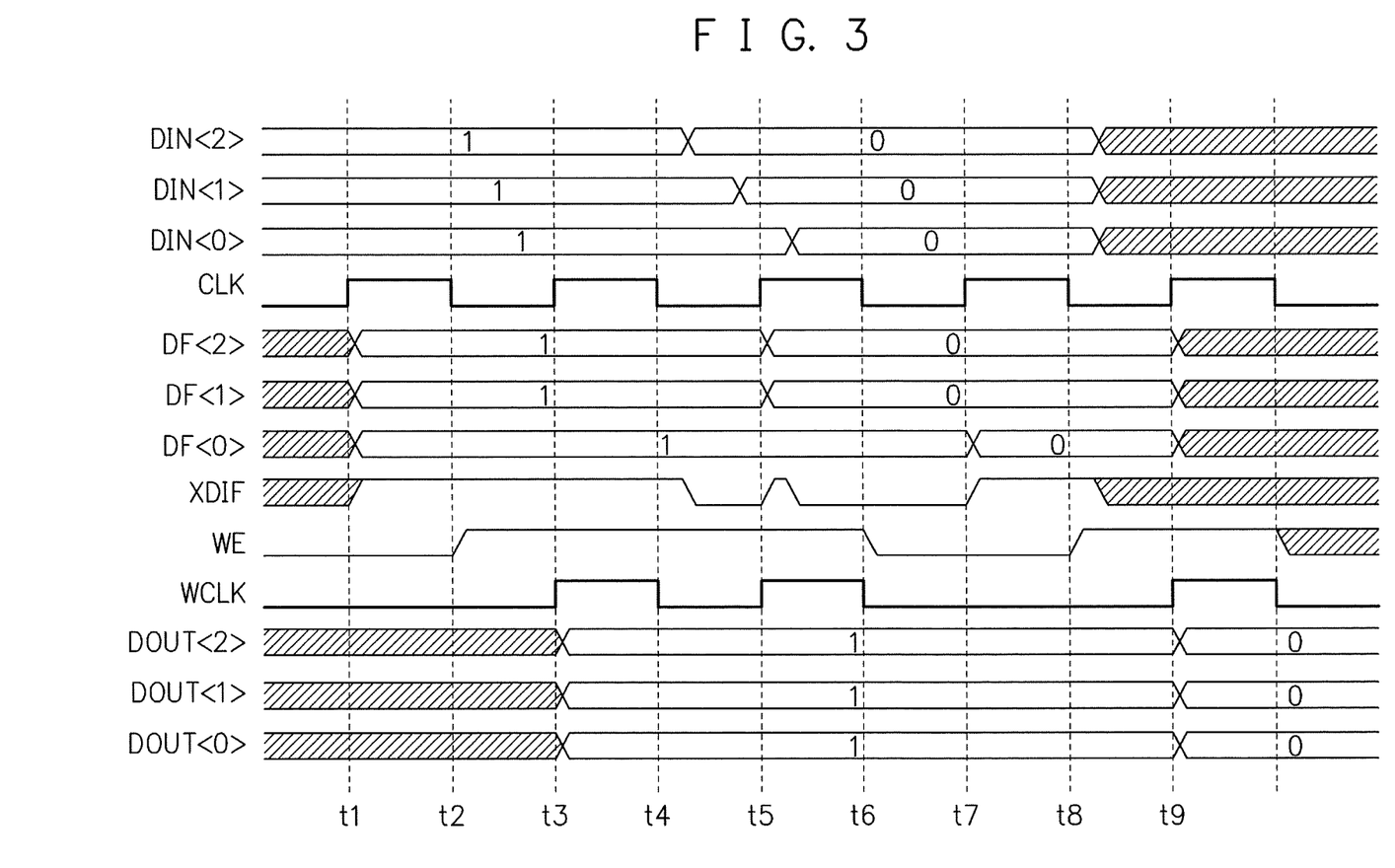
FIG. 3 is a timing chart illustrating an operation example of the receiver circuit in FIG. 2.

FIG. 2 is a circuit diagram illustrating a configuration example of each of the receiver circuits 107 and 113 in FIG. 1, and FIG. 3 is a timing chart illustrating an operation example of the receiver circuit in FIG. 2. The receiver circuits 107 and 113 have the same configuration with each other. The receiver circuits 107 and 113 each include flip-flop circuits 200 to 202, 207, 209 to 211, exclusive logical sum circuits 203 to 205, a negative logical sum circuit 206, and a logical product circuit 208.

The receiver circuit 107 receives, for example, three-bit reception data (offset cancellation data) DIN<0> to DIN<2> and a clock signal CLK from the transmission circuit 110, and outputs, for example, three-bit reception data (offset cancellation data) DOUT<0> to DOUT<2> to the differential amplifier 104.

The receiver circuit 113 receives, for example, three-bit reception data (phase control data) DIN<0> to DIN<2> and the clock signal CLK from the transmission circuit 111, and outputs, for example, three-bit reception data (phase control data) DOUT<0> to DOUT<2> to the phase interpolation circuit 112.

The three pieces of first flip-flop circuits 200 to 202 are first holding circuits, respectively receive the three-bit reception data DIN<0> to DIN<2>, and respectively latch the three-bit reception data DIN<0> to DIN<2> in synchronization with a rising edge (first edge) of the same clock signal CLK.

The first flip-flop circuit 200 latches the reception data DIN<0> in synchronization with the rising edge of the clock signal CLK, holds the latched reception data, and outputs a latched reception data DF<0>. The first flip-flop circuit 201 latches the reception data DIN<1> in synchronization with the rising edge of the clock signal CLK, holds the latched reception data, and outputs a latched reception data DF<1>. The first flip-flop circuit 202 latches the reception data DIN<2> in synchronization with the rising edge of the clock signal CLK, holds the latched reception data, and outputs a latched reception data DF<2>.

The exclusive logical sum circuit 203 outputs low-level when the reception data DIN<0> and DF<0> are the same with each other, and outputs high-level when the reception data DIN<0> and DF<0> are different from one another. The exclusive logical sum circuit 204 outputs low-level when the reception data DIN<1> and DF<1> are the same with each other, and outputs high-level when the reception data DIN<1> and DF<1> are different from one another. The exclusive logical sum circuit 205 outputs low-level when the reception data DIN<2> and DF<2> are the same with each other, and outputs high-level when the reception data DIN<2> and DF<2> are different from one another.

The negative logical sum circuit 206 outputs a negative logical sum signal XDIF of output signals of the exclusive logical sum circuits 203 to 205. The flip-flop circuit 207 latches the negative logical sum signal XDIF in synchronization with a falling edge (second edge) of the clock signal CLK, holds the latched signal, and outputs a latched signal WE. The logical product circuit 208 outputs a logical product signal of the signal WE and the clock signal CLK as a clock signal WCLK.

The three pieces of second flip-flop circuits 209 to 211 are second holding circuits, and respectively latch the reception data DF<0> to DF<2> which are latched by the three pieces of first flip-flop circuits 200 to 202 in synchronization with the rising edge of the same clock signal WCLK.

The second flip-flop circuit 209 latches the reception data DF<0> in synchronization with the rising edge of the clock signal WCLK, holds the latched reception data, and outputs the latched reception data DOUT<0>. The second flip-flop circuit 210 latches the reception data DF<1> in synchronization with the rising edge of the clock signal WCLK, holds the latched reception data, and outputs the latched reception data DOUT<1>. The second flip-flop circuit 211 latches the reception data DF<2> in synchronization with the rising edge of the clock signal WCLK, holds the latched reception data, and outputs the latched reception data DOUT<2>.

The transmission circuits 110 and 111 respectively transmit the three-bit data DIN<0> to DIN<2> simultaneously. However, the receiver circuits 107 and 113 receive each of the three-bit data DIN<0> to DIN<2> at different timings as illustrated in FIG. 3 resulting from a difference in lengths of transmission lines of the three-bit data DIN<0> to DIN<2> or the like. For example, the reception data DIN<2> is received within a shortest delay time, the reception data DIN<1> is received within a second shortest delay time, and the reception data DIN<0> is received within a longest delay time. Namely, at times t4 to t6, the reception data DIN<0> to DIN<2> have different data transition timings from one another.

At a time t1, the first flip-flop circuits 200 to 202 respectively latch the reception data DIN<0> to DIN<2> of "1", and respectively output the reception data DF<0> to DF<2> of "1" in synchronization with the rising edge of the clock signal CLK. The exclusive logical sum circuits 203 to 205 respectively output low-level because the reception data DIN<0> to DIN<2> of "1" and the reception data DF<0> to DF<2> of "1" are the same. Then, the negative logical sum circuit 206 outputs the negative logical sum signal XDIF in high-level.

Next, at a time t2, the flip-flop circuit 207 latches the negative logical sum signal XDIF in high-level, and outputs the signal WE in high-level in synchronization with the falling edge of the clock signal CLK. Here, the falling edge of the clock signal CLK defining the latch timing of the flip-flop circuit 207 is a subsequent edge of the rising edge of the clock signal CLK defining the latch timings of the first flip-flop circuits 200 to 202, and is a half-cycle later edge. The logical product circuit 208 outputs the clock signal WCLK having the same cycle with the clock signal CLK.

Next, at a time t3, the first flip-flop circuits 200 to 202 respectively latch the reception data DIN<0> to DIN<2> of "1", and respectively output the reception data DF<0> to DF<2> of "1" in synchronization with the rising edge of the clock signal CLK. The exclusive logical sum circuits 203 to 205 respectively output low-level because the reception data DIN<0> to DIN<2> of "1" and the reception data DF<0> to DF<2> of "1" are the same. Then, the negative logical sum circuit 206 outputs the negative logical sum signal XDIF in high-level.

The second flip-flop circuits 209 to 211 respectively latch the reception data DF<0> to DF<2> of "1", and respectively output the reception data DOUT<0> to DOUT<2> of "1" in synchronization with the rising edge of the clock signal WCLK.

Next, at a time t4, the flip-flop circuit 207 latches the negative logical sum signal XDIF in high-level, and outputs the signal WE in high-level in synchronization with the falling edge of the clock signal CLK. The logical product circuit 208 outputs the clock signal WCLK which is the same as the clock signal CLK.

Next, at a time t5, the second flip-flop circuits 209 to 211 respectively latch the reception data DF<0> to DF<2> of "1", and respectively output the reception data DOUT<0> to DOUT<2> of "1" in synchronization with the rising edge of the clock signal WCLK.

The first flip-flop circuits 201 and 202 respectively latch the reception data DIN<1> and DIN<2> of "0", and respectively output the reception data DF<1> to DF<2> of "0" in synchronization with the rising edge of the clock signal CLK. On the other hand, the first flip-flop circuit 200 latches the reception data DIN<0> of "1", and outputs the reception data DF<0> of "1" in synchronization with the rising edge of the clock signal CLK.

Next, at a time t6, the exclusive logical sum circuits 204 and 205 respectively output low-level because the reception data DIN<1> and DIN<2> of "0" and the reception data DF<1> and DF<2> of "0" are the same. On the other hand, the exclusive logical sum circuit 203 outputs high-level because the reception data DIN<0> of "0" and the reception data DF<0> of "1" are different. Then, the negative logical sum circuit 206 outputs the negative logical sum signal XDIF in low-level. The flip-flop circuit 207 latches the negative logical sum signal XDIF in low-level, and outputs the signal WE in low-level in synchronization with the falling edge of the clock signal CLK. The logical product circuit 208 outputs the clock signal WCLK in low-level.

Next, at a time t7, the first flip-flop circuits 200 to 202 respectively latch the reception data DIN<0> to DIN<2> of "0", and respectively output the reception data DF<0> to DF<2> of "0" in synchronization with the rising edge of the clock signal CLK. The exclusive logical sum circuits 203 to 205 respectively output low-level because the reception data DIN<0> to DIN<2> of "0", and the reception data DF<0> to DF<2> of "0" are the same. Then, the negative logical sum circuit 206 outputs the negative logical sum signal XDIF in high-level. Note that the clock signal WCLK keeps low-level, and therefore, the second flip-flop circuits 209 to 211 do not perform the latch.

Next, at a time t8, the flip-flop circuit 207 latches the negative logical sum signal XDIF in high-level, and outputs the signal WE in high-level in synchronization with the falling edge of the clock signal CLK. The logical product circuit 208 outputs the clock signal WCLK which is the same as the clock signal CLK.

Next, at a time t9, the second flip-flop circuits 209 to 211 respectively latch the reception data DF<0> to DF<2> of "0", and respectively output the reception data DOUT<0> to DOUT<2> of "0" in synchronization with the rising edge of the clock signal WCLK.

The times t1 to t3 represent operations during a period when the reception data DIN<0> to DIN<2> are stable for a half cycle or more of the clock signal CLK. The times t5 to t6 represent operations during a period when the reception data DIN<0> to DIN<2> are in transition. The times t7 to t9 represent operations during a period when the reception data DIN<0> to DIN<2> are stable for a half cycle or more of the clock signal CLK as same as the times t1 to t3. At the time t7 when the reception data DIN<0> to DIN<2> are in transition, the clock signal WCLK is in low-level, and therefore, the reception data DOUT<0> to DOUT<2> which are output from the second flip-flop circuits 209 to 211 do not change.

Note that hereinabove, an example of the three-bit reception data DIN<0> to DIN<2> is described, but the reception data may be two-bit, or four-bit or more.

As stated above, the plurality of first flip-flop circuits 200 to 202 respectively receive the plurality of reception data DIN<0> to DIN<2>, respectively latch the plurality of reception data DIN<0> to DIN<2>, and respectively output the plurality of reception data DF<0> to DF<2> based on the same clock signal CLK.

The exclusive logical sum circuits 203 to 205, the negative logical sum circuit 206, and the flip-flop circuit 207 are comparison circuits, and respectively compare the reception data DF<0> to DF<2> which are respectively latched by the plurality of first flip-flop circuits 200 to 202 and the reception data DIN<0> to DIN<2> which are respectively input to the plurality of first flip-flop circuits 200 to 202 after a certain time elapses (for example, at the time t6) since the latch time of the plurality of first flip-flop circuits 200 to 202 (for example, at the time t5). The certain time is a time from the rising to the falling of the clock signal CLK. The flip-flop circuit 207 outputs high-level when the reception data of all bits are identical, and outputs low-level when they are not identical.

The plurality of second flip-flop circuits 209 to 211 respectively latch the reception data DF<0> to DF<2> which are respectively latched by the plurality of first flip-flop circuits 200 to 202, and respectively output the plurality of reception data DOUT<0> to DOUT<2> when output signals of the comparison circuits indicate that the reception data DF<0> to DF<2> which are respectively latched by the plurality of first flip-flop circuits 200 to 202 and the reception data DIN<0> to DIN<2> which are respectively input to the plurality of first flip-flop circuits 200 to 202 are identical.

According to the present embodiment, the receiver circuits 107 and 113 are able to output the three-bit reception data DOUT<0> to DOUT<2> whose data transition timings are the same even when they respectively receive the three-bit reception data DIN<0> to DIN<2> whose data transition timings are different.

The receiver circuits 107 and 113 are able to determine whether or not the reception data DIN<0> to DIN<2> are stable. When the reception data DIN<0> to DIN<2> and the reception data DF<0> to DF<2> are not respectively identical after the first flip-flop circuits 200 to 202 latch and after a certain time (the half cycle of the clock signal CLK) elapses, it can be determined that the reception data DIN<0> to DIN<2> are in transition, and the reception data DF<0> to DF<2> are incorrect data. On the other hand, when the reception data DIN<0> to DIN<2> and the reception data DF<0> to DF<2> are respectively identical, it is considered that the reception data DIN<0> to DIN<2> are stable data, and the second flip-flop circuits 209 to 211 respectively latch the reception data DF<0> to DF<2>, and thereby, it is possible to obtain the correct reception data DOUT<0> to DOUT<2>.

When the receiver circuit does not exist, it is necessary to design transmission timings of the transmission circuits 110 and 111 under a timing constraint considering the skew resulting from transmission and a setup/hold time of the flip-flop circuit as for the reception data DIN<0> to DIN<2> of all bits and the clock signal CLK, and when the timing constraint is not satisfied, lowering of performance such that an operating frequency is lowered or a man-hour for redesign become necessary.

The receiver circuits 107 and 113 of the embodiment prevent the latch of the incorrect reception data during the data transition, and therefore, requirements for the design of the transmission circuits 110 and 111 are relaxed. In the embodiment, it is enough to suppress the skew among the reception data DIN<0> to DIN<2> within the half cycle of the clock signal CLK, and the timing constraint between the reception data DIN<0> to DIN<2> and the clock signal CLK does not occur.

Besides, in the embodiment, it is not necessary that the clock signal CLK of the receiver circuits 107 and 113 is synchronized with the clock signal of the transmission circuits 110 and 111. Namely, the receiver circuits 107 and 113 do not receive the clock signal CLK from the transmission circuits 110 and 111, and may internally generate the clock signal CLK.

Second Embodiment

Figure 4:
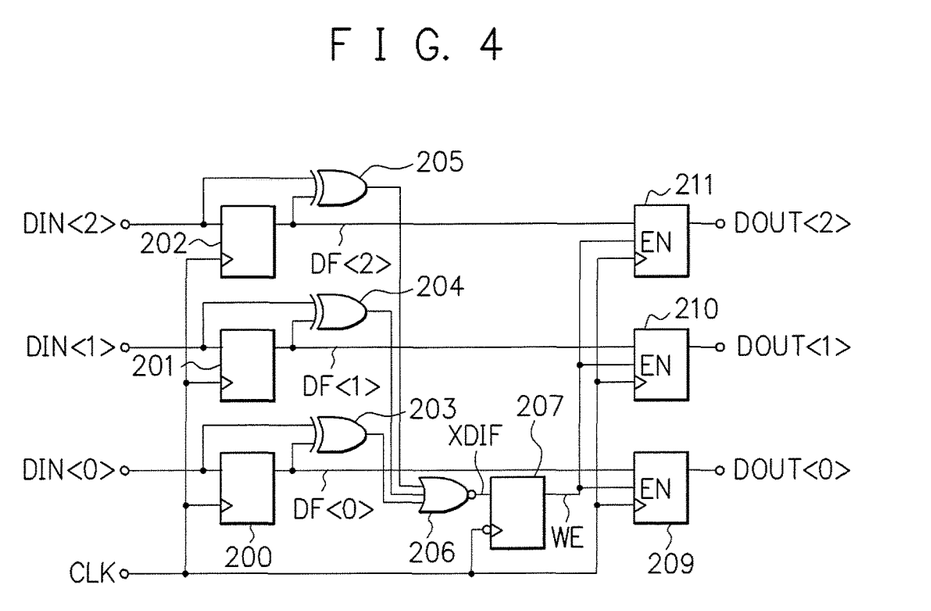
FIG. 4 is a circuit diagram illustrating a configuration example of a receiver circuit according to a second embodiment.
Figure 5:
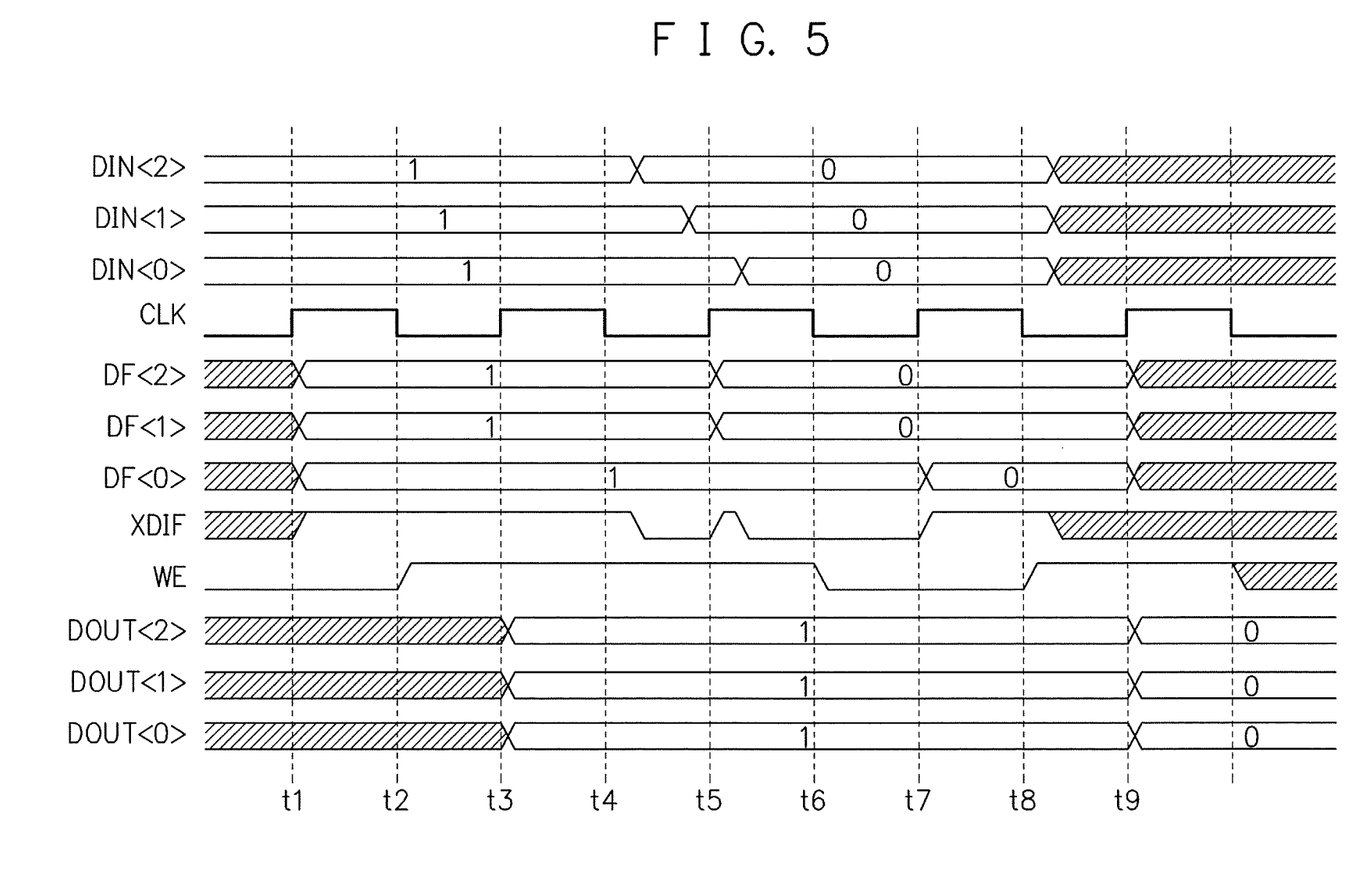
FIG. 5 is a timing chart illustrating an operation example of the receiver circuit in FIG. 4.

FIG. 4 is a circuit diagram illustrating a configuration example of each of the receiver circuits 107 and 113 according to a second embodiment, and FIG. 5 is a timing chart illustrating an operation example of the receiver circuit in FIG. 4. The receiver circuit of the embodiment (FIG. 4) is ones in which the logical product circuit 208 is deleted from the receiver circuit of the first embodiment (FIG. 2). Hereinafter, points in which the embodiment is different from the first embodiment are described.

Each of the second flip-flop circuits 209 to 211 includes an enable terminal EN in addition to an input terminal, a clock terminal and an output terminal. The signal WE which is output from the flip-flop circuit 207 is input to the enable terminal EN of each of the second flip-flop circuits 209 to 211. The clock signal CLK is input to the clock terminal of each of the second flip-flop circuits 209 to 211. The reception data DF<0> to DF<2> are respectively input to the input terminals of the second flip-flop circuits 209 to 211. The output terminals of the second flip-flop circuits 209 to 211 respectively output the reception data DOUT<0> to DOUT<2>.

When the signal WE is in high-level, the second flip-flop circuits 209 to 211 respectively latch the reception data DF<0> to DF<2>, and respectively output the reception data DOUT<0> to DOUT<2> in synchronization with the rising edge of the clock signal CLK. Besides, when the signal WE is in low-level, the second flip-flop circuits 209 to 211 do not respectively latch the reception data DF<0> to DF<2>.

At a time t3, the second flip-flop circuits 209 to 211 respectively latch the reception data DF<0> to DF<2> of "1", and respectively output the reception data DOUT<0> to DOUT<2> of "1" in synchronization with the rising edge of the clock signal CLK because the signal WE is in high-level.

At a time t5, the second flip-flop circuits 209 to 211 respectively latch the reception data DF<0> to DF<2> of "1", and respectively output the reception data DOUT<0> to DOUT<2> of "1" in synchronization with the rising edge of the clock signal CLK because the signal WE is in high-level.

At a time t7, the second flip-flop circuits 209 to 211 do not latch because the signal WE is in low-level.

At a time t9, the second flip-flop circuits 209 to 211 respectively latch the reception data DF<0> to DF<2> of "0", and respectively output the reception data DOUT<0> to DOUT<2> of "0" in synchronization with the rising edge of the clock signal CLK because the signal WE is in high-level.

The receiver circuits 107 and 113 of the embodiment are able to output the same reception data DOUT<0> to DOUT<2> and to obtain the same effect relative to the receiver circuits 107 and 113 of the first embodiment.

According to the first and second embodiments, it is possible to make the data transition timings of the plurality of reception data DOUT<0> to DOUT<2> which are respectively latched by the plurality of second flip-flop circuits 209 to 211 identical with each other even when the data transition timings of the plurality of reception data DIN<0> to DIN<2> respectively received by the plurality of first flip-flop circuits 200 to 202 are different.

Incidentally, the above-described embodiments are to be considered in all respects as illustrative and no restrictive. Namely, the present invention may be embodied in other specific forms without departing from the spirit or essential characteristics thereof.

It is possible to make coincident transition timings of a plurality of reception data which are respectively latched by a plurality of second holding circuits even when data transition timings of the plurality of reception data which are respectively received by a plurality of first holding circuits are different.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A receiver circuit, comprising:
   a plurality of first holding circuits configured to respectively latch a plurality of reception data based on a same clock signal;
   a comparison circuit configured to respectively compare first reception data and second reception data after a certain time elapses since the latch of the plurality of first holding circuits, the first reception date being respectively latched by the plurality of first holding circuits, the second reception data being respectively input to the plurality of first holding circuits; and
   a plurality of second holding circuits configured to respectively latch the first reception data when a first output signal of the comparison circuit indicates that the first reception data and the second reception data are identical.

2. The receiver circuit according to claim 1, wherein the plurality of first holding circuits are configured to latch in synchronization with a first edge of the clock signal, and the comparison circuit is configured to compare in synchronization with a second edge of the clock signal, the second edge being a subsequent edge of the first edge.

3. The receiver circuit according to claim 1, wherein the plurality of second holding circuits are configured to latch in synchronization with the same clock signal.

4. The receiver circuit according to claim 2, wherein the first edge is one of a rising edge and a falling edge of the same clock signal, and the second edge is the other of the rising edge and the falling edge of the same clock signal.

5. The receiver circuit according to claim 1, further comprising:
   a logical product circuit configured to output a logical product signal of the output signal of the comparison circuit and the clock signal,
   wherein the plurality of second holding circuits are configured to latch in synchronization with an output signal of the logical product circuit.

6. The receiver circuit according to claim 1,
   wherein the comparison circuit includes a plurality of comparators that are corresponding to the plurality of the first holding circuits and generate a plurality of second output signals as the first output signal,
   each of the plurality of second holding circuits includes an enable terminal and a clock terminal,
   the second output signals of the plurality of comparators are input to the enable terminals of the plurality of second holding circuits, and
   the clock signal is input to the clock terminal of each of the plurality of second holding circuits.

7. A semiconductor integrated circuit, comprising:
   a receiver circuit; and
   an internal circuit configured to operate based on data received by the receiver circuit,
   wherein the receiver circuit includes:
   a plurality of first holding circuits configured to respectively latch a plurality of reception data based on a same clock signal;
   a comparison circuit configured to respectively compare first reception data and second reception data after a certain time elapses since the latch of the plurality of first holding circuits, the first reception date being respectively latched by the plurality of first holding circuits, the second reception date being respectively input to the plurality of first holding circuits; and
   a plurality of second holding circuits configured to respectively latch the first reception data when a first output signal of the comparison circuit indicates that the first reception data and the second reception data are identical.

8. The semiconductor integrated circuit according to claim 7, further comprising:
   a transmission circuit configured to transmit a plurality of transmission data,
   wherein the receiver circuit receives the plurality of transmission data from the transmission circuit.

9. The semiconductor integrated circuit according to claim 7,
   wherein the plurality of first holding circuits are configured to latch in synchronization with a first edge of the clock signal, and
   the comparison circuit is configured to compare in synchronization with a second edge of the clock signal, the second edge being a subsequent edge of the first edge.

10. The semiconductor integrated circuit according to claim 7, wherein the plurality of second holding circuits are configured to latch in synchronization with the same clock signal.

11. The semiconductor integrated circuit according to claim 9,
    wherein the first edge is one of a rising edge and a falling edge of the same clock signal, and
    the second edge is the other of the rising edge and the falling edge of the same clock signal.

12. The semiconductor integrated circuit according to claim 7, wherein the receiver circuit includes a logical product circuit configured to output a logical product signal of the output signal of the comparison circuit and the clock signal, and the plurality of second holding circuits are configured to latch in synchronization with an output signal of the logical product circuit.

13. The semiconductor integrated circuit according to claim 7,
wherein the comparison circuit includes a plurality of comparators that are corresponding to the plurality of the first holding circuits and generate a plurality of second output signals as the first output signal,
each of the plurality of second holding circuits includes an enable terminal and a clock terminal,
the second output signals of the plurality of comparators are input to the enable terminals of the plurality of second holding circuits, and
the clock signal is input to the clock terminal of each of the plurality of second holding circuits.

* * * * *